United States Patent
Kim et al.

(10) Patent No.: US 12,528,098 B2
(45) Date of Patent: Jan. 20, 2026

(54) APPARATUS FOR PRESSURIZING PHOTORESIST AND SYSTEM FOR SUPPLYING PHOTORESIST

(71) Applicant: SEMES CO., LTD., Cheonan-si (KR)

(72) Inventors: Hae Kyung Kim, Cheonan-si (KR); Dae Sung Kim, Cheonan-si (KR); Woo Sin Jung, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 441 days.

(21) Appl. No.: 18/059,681

(22) Filed: Nov. 29, 2022

(65) Prior Publication Data

US 2023/0173520 A1 Jun. 8, 2023

(30) Foreign Application Priority Data

Dec. 2, 2021 (KR) .................. 10-2021-0171318

(51) Int. Cl.
  *B05B 12/08* (2006.01)
  *G03F 7/16* (2006.01)

(52) U.S. Cl.
  CPC .............. *B05B 12/081* (2013.01); *G03F 7/16* (2013.01)

(58) Field of Classification Search
  None
  See application file for complete search history.

(56) References Cited

U.S. PATENT DOCUMENTS

| | | | | |
|---|---|---|---|---|
| 5,976,256 | A | * 11/1999 | Kawano | B05C 5/0254 118/684 |
| 9,011,378 | B2 | * 4/2015 | Luciano | A61M 27/002 604/153 |
| 11,333,142 | B2 | * 5/2022 | Ishimaru | F04B 43/113 |
| 11,733,616 | B2 | * 8/2023 | Sasa | G03F 7/16 355/27 |
| 2011/0004158 | A1 | 1/2011 | Luciano et al. | |
| 2014/0350511 | A1 | * 11/2014 | Carlisle | A61M 5/365 604/126 |
| 2016/0228637 | A1 | * 8/2016 | Carlisle | A61M 5/155 |
| 2020/0256330 | A1 | * 8/2020 | Ishimaru | F04B 43/084 |

FOREIGN PATENT DOCUMENTS

| | | |
|---|---|---|
| JP | 2016-521813 A | 7/2016 |
| JP | 2017-028089 A | 2/2017 |
| JP | 2020-128723 A | 8/2020 |
| KR | 10-2020-0097639 A | 8/2020 |

* cited by examiner

*Primary Examiner* — Jethro M. Pence
(74) *Attorney, Agent, or Firm* — Harness, Dickey & Pierce, P.L.C.

(57) ABSTRACT

Provided is a pressurizing apparatus that pressurizes a photoresist. In an embodiment, the pressurizing apparatus includes: a housing including a wall surface defining an internal space; a film separating the internal space into a first space and a second space; a first inlet which is in communication with the first space; a second outlet which is in communication with the first space; and a pressurization gas inlet which is in communication with the second space, and in the housing, a transverse section of the internal space has a large width of a first direction and a small width of a second direction perpendicular to the first direction, and the width of the internal space in the second direction includes a section which is narrowed toward a second side which is the other side from a first side which is one side in the first direction.

20 Claims, 15 Drawing Sheets

APPARATUS FOR PRESSURIZING PHOTORESIST AND SYSTEM FOR SUPPLYING PHOTORESIST

CROSS-REFERENCE TO RELATED APPLICATIONS

This application claims priority to and the benefit of the Korean Patent Application No. 10-2021-0171318 filed in the Korean Intellectual Property Office on Dec. 2, 2021, the entire contents of which are incorporated herein by reference.

TECHNICAL FIELD

The present invention relates to an apparatus for pressurizing a photoresist and a system for supplying a photoresist, which including the same.

BACKGROUND ART

In general, semiconductor devices are manufactured by a Fab process of forming an electrical circuit on a silicon wafer used as a semiconductor substrate, an electrical die sorting (EDS) process of inspecting electrical properties of the semiconductor devices formed in the Fab process, and a packet assembly process of encapsulating and individualizing the respective semiconductor devices with an epoxy resin.

The Fab process includes a deposition process for forming a film on the semiconductor substrate, a chemical and mechanical polishing process for flattening the film, a photolithography process for forming a photoresist pattern on the film, an etching process for forming the film with a pattern having the electrical property by using the photoresist pattern, an ion injection process for injecting a specific ion into a predetermined area of the semiconductor substrate, a cleaning process for removing impurities on the semiconductor substrate, and an inspection process for forming the surface of the semiconductor substrate with the film or the pattern.

Among the unit processes, the photolithography process includes a process of forming a photoresist film on the semiconductor substrate and curing the photoresist film, and an exposure process and a development process of removing a predetermined portion in order to form the photoresist film formed on the semiconductor substrate with a desired photosensitive pattern.

In general, the photoresist film is formed as follows. First, the semiconductor substrate is placed on a rotation chuck, and then a photoresist is supplied to a center portion of the semiconductor substrate, and the semiconductor substrate is rotated. The photoresist supplied to the center portion of the semiconductor substrate is pushed to a periphery portion of the semiconductor substrate by rotational force of the semiconductor substrate, and as a result, the resist film is formed.

The photoresist is supplied by a photoresist supplying system. A photoresist supply distance of the photoresist supplying system has a length of approximately 4 to 5 mm in an actual manufacturing process of the semiconductor device. The photoresist supply distance may correspond to a length of a supply line, and fine air bubbles are generated in the photoresist while the photoresist passes through the supply line, various valves, and a pump. The generated fine air bubbles are core-spreading while passing through the supply line, and initially grown into air bubbles having a size of approximately 1 mm or less to approximately 100 mm.

When the photoresist having the air bubble is supplied to the semiconductor substrate, a non-uniform photoresist film is formed on the semiconductor substrate, and this causes a defect of the photosensitive pattern, and leads to an additional process defect in a subsequent process.

Therefore, a pressurization apparatus which is installed on the supply line and pressurizes the photoresist is provided. The pressurization apparatus has a space therein, and the space is separated by the film. One space is a space filled with the photoresist and the other space is a space filled with pressurization gas pressurizing the photoresist. As the pressurization apparatus has a long pipe form in one direction, a structure in which contraction and expansion ranges of the film pressurizing the photoresist are narrow, and the film is coupled to a pipe-shaped end portion should be provided, so a fitting having a special specification should be applied to a portion connected to the supply line, and the pressurization apparatus may have only one inlet and one outlet. Further, it is low efficient to remove the bubble inside the pressurization apparatus, and it is difficult to measure a capacity of the photoresist filled inside the pressurization apparatus.

SUMMARY OF THE INVENTION

An object of the present invention is to provide an apparatus for pressurizing a photoresist and a system for supplying the photoresist capable of efficiently treating a substrate.

An object of the present invention is to provide an apparatus for pressurizing a photoresist, which has high removal efficiency of bubbles inside the pressurizing apparatus.

An object of the present invention is to provide an apparatus for pressurizing a photoresist, in which a level sensor for measuring an internal capacity of the pressurizing apparatus is enabled to be attached to improve uncertainty of capacity measurement of a photoresist received in the pressurizing apparatus.

An object of the present invention is to provide an apparatus for pressurizing a photoresist, in which an internal capacity of the pressurizing apparatus is extended and utilization of an installation space may be increased.

An object of the present invention is to provide an apparatus for pressurizing a photoresist, in which a plurality of inlets and a plurality of outlets may be provided.

However, the object of the present invention are not limited thereto, and other objects present invention will be enabled to be apparently appreciated by those skilled in the art from the following a description given below.

An embodiment of the present invention provides a pressurizing apparatus that pressurizes a photoresist. In an embodiment, the pressurizing apparatus includes: a housing including a wall surface defining an internal space; a film separating the internal space into a first space and a second space; a first inlet which is in communication with the first space; a second outlet which is in communication with the first space; and a pressurization gas inlet which is in communication with the second space, and in the housing, a transverse section of the internal space has a large width of a first direction and a small width of a second direction perpendicular to the first direction, and the width of the internal space in the second direction includes a section which is narrowed toward a second side which is the other side from a first side which is one side in the first direction.

In an embodiment, the first inlet may be provided at an upper portion adjacent to the first side of the housing.

In an embodiment, the first outlet may be provided at a lower portion adjacent to the first side of the housing.

In an embodiment, the second outlet may be provided at a lower portion adjacent to the second side of the housing.

In an embodiment, film may be provided on a wall surface toward the second side from the first side on the wall surface.

In an embodiment, the pressurizing apparatus may further include an air bubble discharging outlet which is in communication with the first space at an upper side of the housing.

In an embodiment, the air bubble discharging outlet may be provided adjacent to the second side.

In an embodiment, a diameter of the second outlet may be smaller than a diameter of the first outlet.

In an embodiment, the second outlet may be connected to a drain line.

In an embodiment, the pressurizing apparatus may further include: a second inlet at the upper side of the housing; and a circulation line of which one end is connected to a second outlet and the other end is connected to the second inlet.

In an embodiment, the pressurizing apparatus may further include a second inlet at the upper side of the housing, and the second outlet may have a smaller diameter than the first inlet.

In an embodiment, the pressurizing apparatus may further include a drain line connected to the circulation line.

In an embodiment, the pressurizing apparatus may further include one or more level sensors provided at a location not overlapped with the film at an outside of the housing.

Further, another embodiment of the present invention provides a system for supplying a photoresist. In an embodiment, the system for supplying a photoresist includes: a buffer tank temporarily storing a liquid; a nozzle discharging the liquid to a substrate; and a pressurizing apparatus provided on a supply line connecting the buffer tank and the nozzle, and the pressurizing apparatus includes a housing which includes a wall surface defining an internal space, and in which a transverse section of the internal space has a large width of a first direction and a small width of a second direction perpendicular to the first direction, and the width of the internal space in the second direction is narrowed toward a second side which is the other side from a first side which is one side in the first direction; a film is provided on a wall surface toward the second side from the first side on the wall surface and separating the internal space into a first space and a second space; a first inlet which is provided at an upper side adjacent to the first side, and is in communication with the first space and connected to a supply line connected to the buffer tank; a first outlet which is provided at a lower side adjacent to the first side, and is in communication with the first space and connected to a supply line connected to the nozzle; a second outlet which is provided at a lower side adjacent to the second side, and is in communication with the first space and directly or indirectly connected to a drain line; and a pressurization gas inlet which is in communication with the second space, and connected to a pressurization gas supply line supplying pressurization gas, and in the housing, transverse section of the internal space has a large width of a first direction and a small width of a second direction perpendicular to the first direction, and the width of the internal space in the second direction includes a section which is narrowed toward a second side which is the other side from a first side which is one side in the first direction.

In an embodiment, the system may further include an air bubble discharging line connected to the upper side of the housing.

In an embodiment, a diameter of the second outlet may be smaller than a diameter of the first outlet.

In an embodiment, the system may further include: a second inlet which is in communication with the first space at the upper side of the housing; and a circulation line of which one end is connected to a second outlet and the other end is connected to the second inlet, and the drain line may be connected to the circulation line.

In an embodiment, the pressurizing apparatus may further include a second inlet at the upper side of the housing, and the second outlet may have a smaller diameter than the first inlet.

In an embodiment, the system may further include a controller, and the controller may control the pressurization gas not to be supplied when a liquid stored in the buffer tank is filled in the pressurizing apparatus, and supply the pressurization gas to the second space to pressurize the liquid after the pressurizing apparatus is filled with the liquid.

Another embodiment of the present invention provides a system for supplying a photoresist, which includes: a buffer tank temporarily storing a liquid; a nozzle discharging the liquid to a substrate; and a pressurizing apparatus provided on a supply line connecting the buffer tank and the nozzle, and the pressurizing apparatus includes a housing which includes a wall surface defining an internal space, and in which a transverse section of the internal space has a large width of a first direction and a small width of a second direction perpendicular to the first direction, and the width of the internal space in the second direction is narrowed toward a second side which is the other side from a first side which is one side in the first direction; a film is provided on a wall surface toward the second side from the first side on the wall surface and separating the internal space into a first space and a second space; a first inlet which is provided at an upper portion adjacent to the first side, and is in communication with the first space and connected to a supply line connected to the buffer tank; a second inlet which is in communication with the first space at the upper side of the housing; a first outlet which is provided at a lower side adjacent to the first side, and is in communication with the first space and connected to a supply line connected to the nozzle; a second outlet which is provided at a lower side adjacent to the second side, and is in communication with the first space and directly or indirectly connected to a drain line; a pressurization gas inlet which is in communication with the second space, and connected to a pressurization gas supply line supplying pressurization gas; and an air bubble discharging line connected to the upper side of the housing, the second inlet has a smaller diameter than the first inlet, and a diameter of the second outlet is smaller than a diameter of the first outlet, and in the housing, a transverse section of the internal space has a large width of a first direction and a small width of a second direction perpendicular to the first direction, and the width of the internal space in the second direction includes a section which is narrowed toward a second side which is the other side from a first side which is one side in the first direction.

According to various embodiments of the present invention, a substrate can be efficiently treated.

According to various embodiments of the present invention, there is high removal efficiency of bubbles inside the pressurizing apparatus.

According to various embodiments of the present invention, a level sensor for measuring an internal capacity of the pressurizing apparatus is enabled to be attached to improve uncertainty of capacity measurement of a photoresist received in the pressurizing apparatus.

According to various embodiments of the present invention, an internal capacity of the pressurizing apparatus is extended and utilization of an installation space may be increased.

According to various embodiments of the present invention, a plurality of inlets and a plurality of outlets may be provided.

The effect of the present invention is not limited to the foregoing effects, and non-mentioned effects will be clearly understood by those skilled in the art from the present specification and the accompanying drawings.

DETAILED DESCRIPTION

Figure 1:
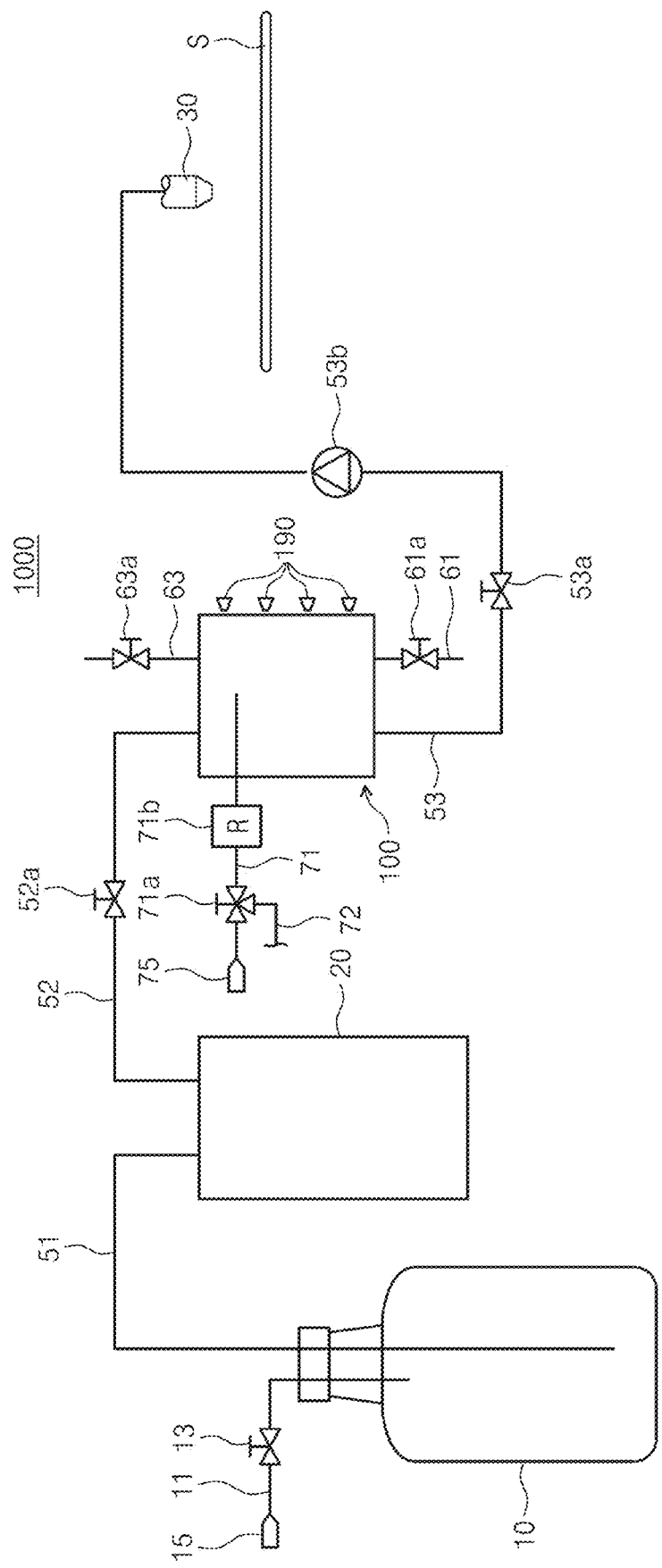
FIG. 1 illustrates a system for supplying a photoresist according to an embodiment of the present invention.

In the following detailed description, embodiments of the present invention have been shown and described, simply by way of illustration. As those skilled in the art would realize, the described embodiments may be modified in various different ways, all without departing from the spirit or scope of the present invention. In the following description of the present invention, a detailed description of known functions and configurations incorporated herein is omitted to avoid making the subject matter of the present invention unclear. Further, the same reference numeral is used for a part which performs a similar function and a similar action through all drawings.

Unless explicitly described to the contrary, the word "include" and variations such as "includes" or "including" will be understood to imply the inclusion of stated elements but not the exclusion of any other elements. Specifically, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

Terms including as first, second, and the like are used for describing various components, but the components should not be limited by the terms. The terms are used only to discriminate one element from another element. For example, a first component may be referred to as a second component, and similarly, the second component may be referred to as the first component without departing from the scope of the present disclosure.

A singular form includes a plural form if there is no clearly opposite meaning in the context. Further, shapes, sizes, and the like of elements in the drawings may be exaggerated for clearer explanation.

FIG. 1 illustrates a system for supplying a photoresist according to an embodiment of the present invention.

The photoresist supplying system 1000 includes a buffer tank 20 and a pressurizing apparatus 100, and a supply line including a first supply line 51, a second supply line 52, and a third supply line 53.

The buffer tank 20 is a component that temporarily stores a photoresist stored in a bottle 10. Water level sensors (not illustrated) are installed at one side of the buffer tank 20 and sense a water level of the photoresist to continuously charge the photoresist at up to an appropriate water level. The buffer tank 20 and the bottle 10 are connected by the first supply line 51. An end portion of the first supply line 51 is extended up to a bottom of the bottle 10 and positioned to be lower than the water level of the photoresist. A first pressurization gas supply line 11 is coupled to the bottle 10. The first pressurization gas supply line 11 connects a first pressurization gas supply source 15 and the bottle 10. A first valve 13 may be installed on the first pressurization gas supply line 11. The first valve 13 may control a flow of pressurization gas which passes through the first pressurization gas supply line 11. For example, the first valve 13 may opens/closes the flow of the pressurization gas or adjust the amount of the pressurization gas which flows. An end portion of the first pressurization gas supply line 11 is positioned to be higher than the water level at which the photoresist is fully filled. The pressurization gas supplied through the first pressurization gas supply line 11 pressurizes the surface of the photoresist. When the photoresist is pressurized, the photoresist is discharged through the first supply line 51 due to a pressure difference.

The pressurizing apparatus 100 is a component that pressurizes the photoresist which flows on a supply system toward the nozzle 30 from the buffer tank 20. For example, the pressurizing apparatus 100 pressurizes the photoresist which passes through the second supply line 52 and the third supply line 53. The second supply line 52 connects the buffer tank 20 and the pressurizing apparatus 100. The third supply line 53 connects the pressurizing apparatus 100 and the nozzle 30. A second valve 52a is installed on the second supply line 52. The second valve 52a may control the flow of the photoresist which passes through the second supply line 52. For example, the second valve 52a may opens/closes the flow of the pressurization gas or adjust the amount of the pressurization gas which flows. A third valve 53a is installed on the third supply line 53. The third valve 53a may control the flow of the photoresist which passes through the third supply line 53. For example, the third valve 53a may opens/closes the flow of the pressurization gas or adjust the amount of the pressurization gas which flows. A pump 53b is installed on the third supply line 53. The pump 53b meters and supplies the photoresist stored in the pressurizing apparatus 100 by a flow pressure generated by suction and discharge operations. The pump 53b suctions the photoresist for one wafer to a pump chamber (not illustrated) from the trap tank 100, and discharges the photoresist to the nozzle 30 at a constant pressure and at a constant flow rate upon application processing. In the embodiment, the pump 53 may be a liquid metering pump.

The nozzle 30 is a component that supplies the photoresist to a substrate S. The nozzle 30 is connected to the third supply line 53 to discharge, to the substrate S, the photoresist which is metered and supplied by the pump 53b.

Figure 2:
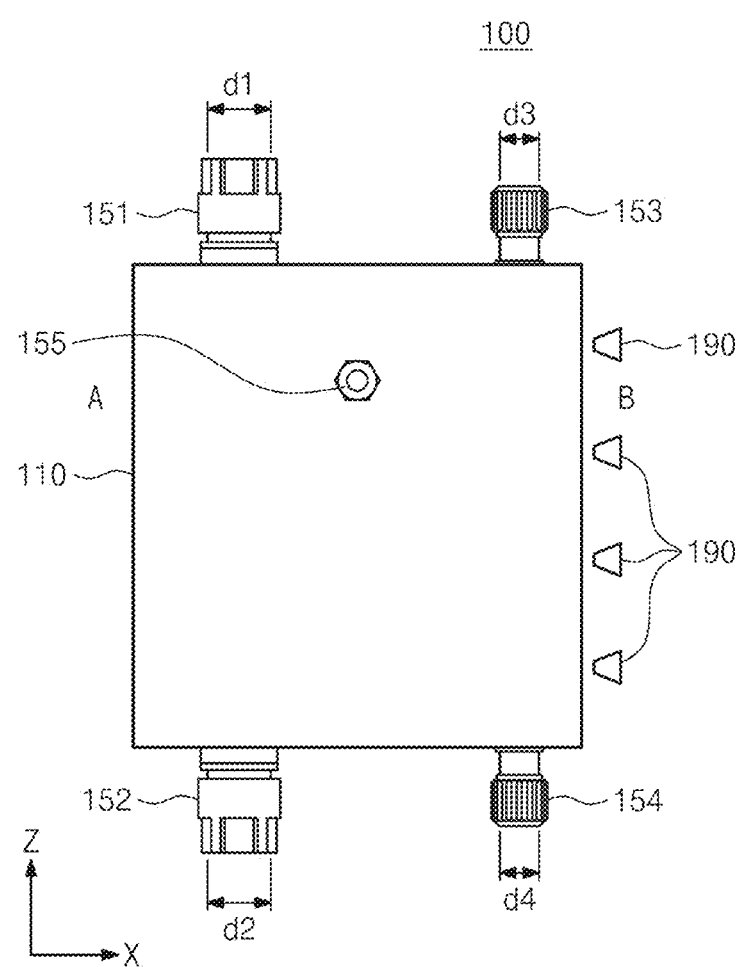
FIG. 2 is a side view of a pressurizing apparatus according to a first embodiment of the present invention.
Figure 3:
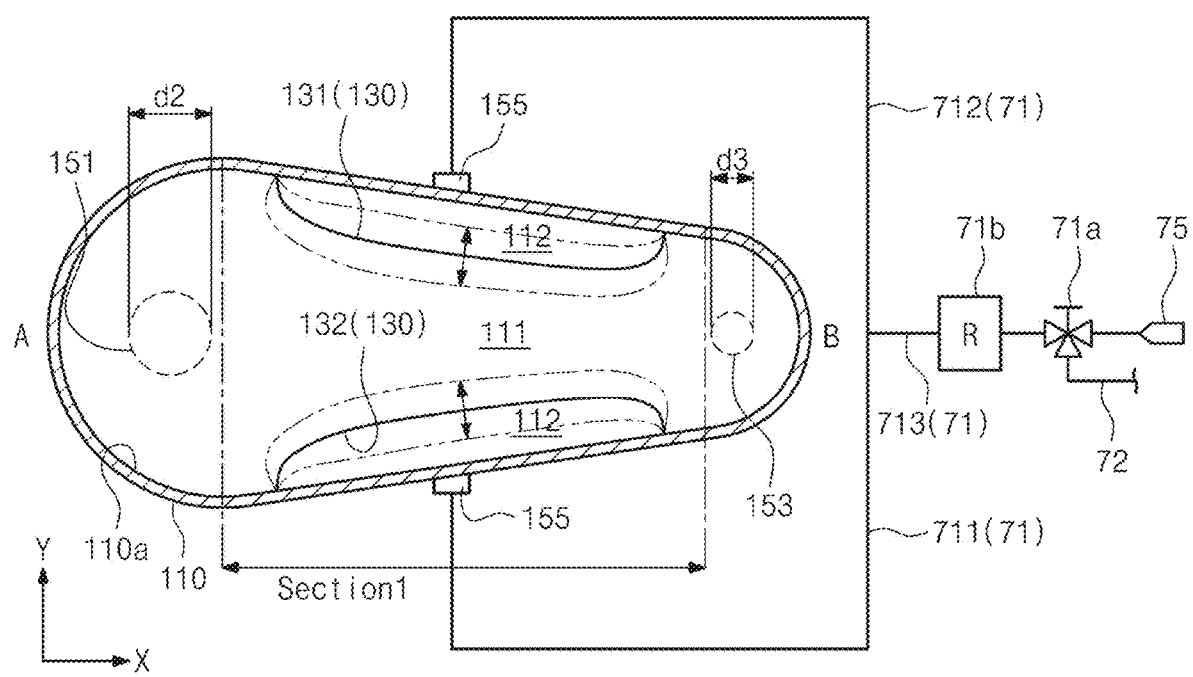
FIG. 3 is a cross-sectional view of the pressurizing apparatus according to a first embodiment of the present invention.

FIG. 2 is a side view of a pressurizing apparatus according to a first embodiment of the present invention. FIG. 3 is a cross-sectional view of the pressurizing apparatus according to a first embodiment of the present invention. By further referring to FIGS. 2 and 3 in addition to FIG. 1, the pressurizing apparatus 100 will be described in detail.

The pressurizing apparatus 100 according to the embodiment includes a housing 110, a film 130, a first inlet 151, a first outlet 152, an air bubble discharging outlet 153, a second outlet 154, a pressurization gas inlet 155, and a level sensor 190.

The housing 110 forms an internal space. The internal space is defined by an inner wall surface 110a by the housing 110. The internal space is separated into a first space 111 and a second space 112 by a film 130. The film 130 completely separates the first space 111 and the second space 112 to disable movement of a fluid. The film 130 may include a first film 131 and a second film 132. The pressurizing apparatus 100 according to the embodiment has a shape in which a side wall of the housing 110 has a larger horizontal width than a pipe type, and as a result, a length may be reduced as compared with the pipe type, so the pressurizing apparatus 100 is to easy to install and has a large capacity. Further, in the case of the pipe type, special fitting should be used due to a portion contacting the film, but in the case of the embodiment, an inlet and an outlet having desired sizes may be set at an upper portion and a lower portion of the housing 110.

The internal space defined by the inner wall surface 110a of the housing 110 has a large width in a first direction x and a small width in a second direction y perpendicular to the first direction x when a transverse section is viewed. The width of the internal space in the second direction y includes Section 1 which become narrower from a first side A which is one side according to the first direction x toward a second side B which is the other side. The film 130 is provided to Section 1. In the embodiment, the first film 131 is provided on an upper inner wall surface according to the second direction y in Section 1 and a second film 132 is provided on a lower inner wall surface according to the second direction y in Section 1.

The first inlet 151 is provided at an upper portion of the housing 110. The first inlet 151 is in communication with the first space 111. The first inlet 151 is provided at an upper portion adjacent to the first side A in the housing 110. The first inlet 151 is connected to the second supply line 52.

The first outlet 152 is provided at a lower portion of the housing 110. The first outlet 152 is provided at the upper portion adjacent to the first side A in the housing 110. The first outlet 152 is in communication with the first space 111. The first outlet 152 is connected to the third supply line 53.

The air bubble discharging outlet 153 is provided at an upper side of the housing 110. The air bubble discharging outlet 153 is provided adjacent to a second side B. The air bubble discharging outlet 153 is connected to an air bubble discharging line 63. The air bubble discharging outlet 153 is connected to the air bubble discharging line 63. An air bubble discharge valve 63a is installed on the air bubble discharging line 63. The air bubble discharge valve 63a controls opening/closing of the air bubble discharging line 63. The air bubble generated in the first space 111 of the pressurizing apparatus 100 may be discharged to the outside of the pressurizing apparatus 100 by opening the air bubble discharging line 63.

The second outlet 154 is provided at the lower portion of the housing 110. The second outlet 154 is provided at the upper portion adjacent to the second side B in the housing 110. The second outlet 154 is in communication with the first space 111. A diameter d4 through which the fluid of the second outlet 154 is smaller than a diameter d2 through which the fluid of the first outlet 152 passes. The second outlet 154 is connected to a drain line 61. A drain valve 61a is installed on the drain line 61. The drain valve 61a controls opening/closing of the drain line 61. The photoresist filled in the first space 111 of the pressurizing apparatus 100 may be drained by opening the drain valve 61a.

The pressurization gas inlet 155 is provided at a side portion of the housing 110. The pressurization gas inlet 155 is in communication with the second space 112. The pressurization gas inlet 155 is connected to a second pressurization gas supply line 71. The second pressurization gas supply line 71 connects the pressurizing apparatus 100 and a second pressurization gas supply source 75. A fourth valve 71a and a regulator 71b are installed on the second pressurization gas supply line 71. The fourth valve 71a may control the flow of the pressurization gas which passes through the second pressurization gas supply line 71. For example, the fourth valve 71a may opens/closes the flow of the pressurization gas or adjust the amount of the pressurization gas which flows. The fourth valve 71a may be provided as a 3-way valve. The fourth valve 71a is connected to a vent line 72. Opening/closing of the vent line 72 may be controlled by the fourth valve 71a. The regulator 71b constantly maintains the pressure of the pressurization gas supplied to the second space 112. In the embodiment, the second space 112 may be formed at two spots by the first film 131 and the second film 132, and the second pressurization gas supply line 71 is branched into a 2-$1^{st}$ pressurization gas supply line 711 and a 2-$2^{nd}$ pressurization gas supply line 712, and connected to respective second spaces 112.

The level sensor 190 is provided at a location without the film 130. In the embodiment, the level sensor 190 is provided in a plural number at the second side B. The level sensor 190 is a component that measures the capacity of the photoresist charged inside the pressurizing apparatus 100. The film 130 hinders the level sensor 190 from measuring the water level as the film 130 is contracted and expanded. As the level sensor 190 is provided at a location not overlapped with the film 130, the water level 190 may measure the water level of the photoresist without being influenced by the film 130.

FIGS. 4 to 10 are diagrams for describing a method for using a photoresist supplying system according to an embodiment, which includes the pressurizing apparatus according to the first embodiment of the present invention, and components are sequentially listed according to the time.

Figure 4:
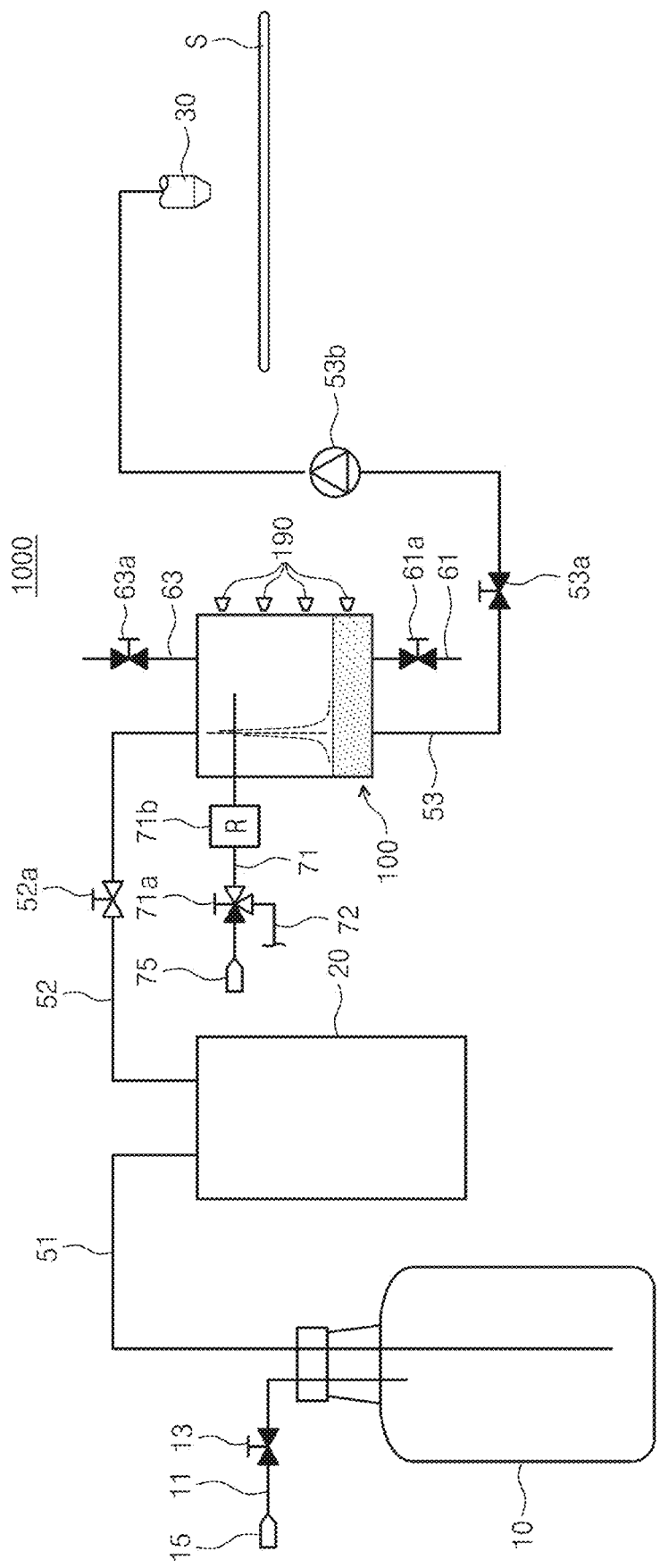
FIG. 4 is a diagram illustrating a state in which the pressuring apparatus is filled with a photoresist.
Figure 5:
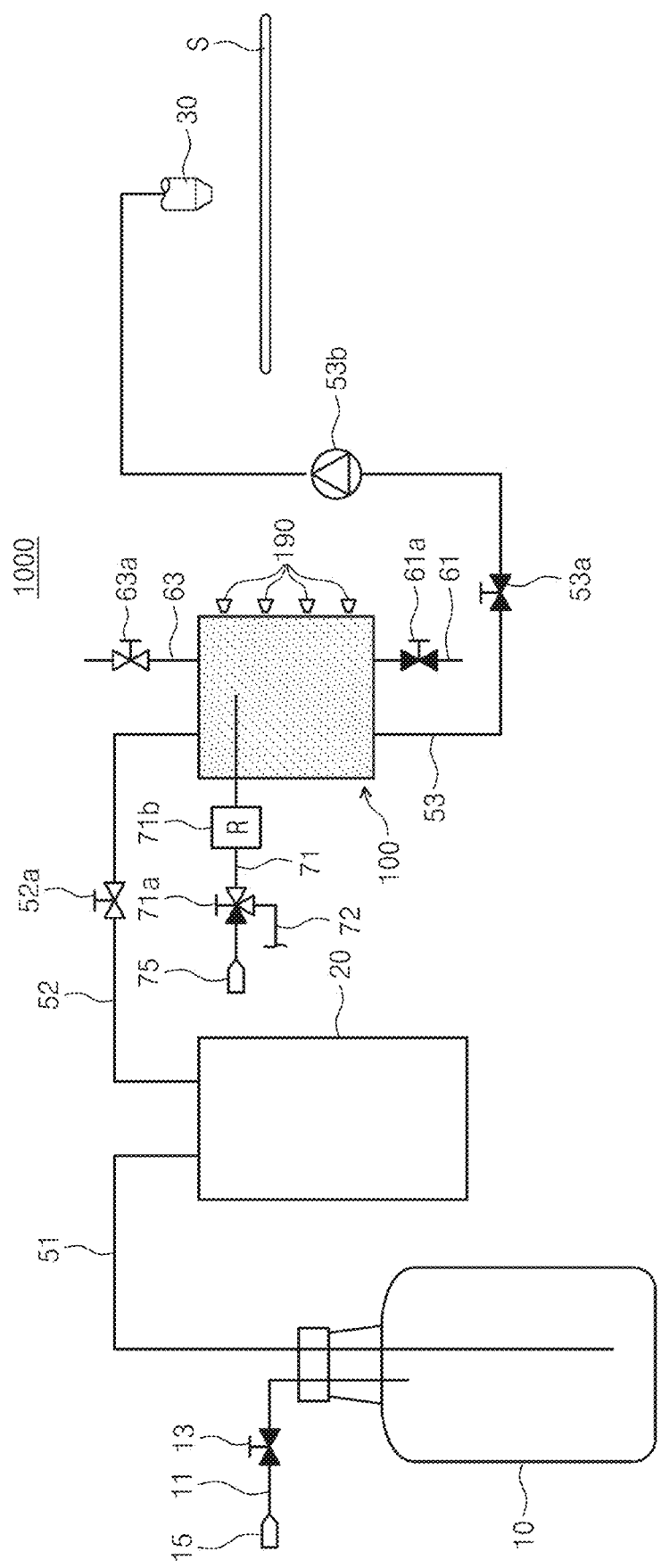
FIG. 5 is a diagram illustrating a state in which the pressuring apparatus is fully filled with the photoresist.

FIG. 4 is a diagram illustrating a state in which the pressuring apparatus is filled with a photoresist. FIG. 5 is a diagram illustrating a state in which the pressuring apparatus is fully filled with the photoresist. Until the photoresist is fully filled in the pressurizing apparatus, the valves are controlled as in [Table 1].

TABLE 1

| Control target | Control method |
| --- | --- |
| Second valve 52a | Opened |
| Third valve 53a | Closed |
| Fourth valve 71a | Pressurization gas supply source 75 side - closed<br>Drain line 72 side - opened |
| Drain valve 61a | Closed |
| Air bubble discharge valve 63a | Opened |

Figure 6:
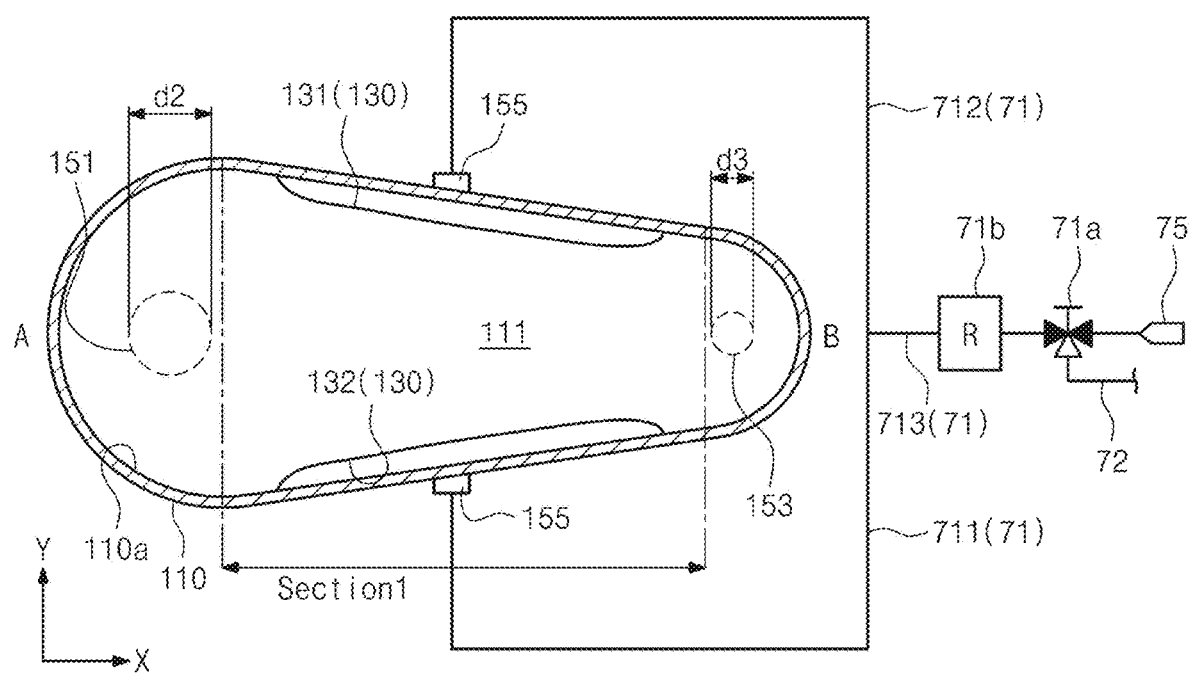
FIG. 6 illustrates a location of a film, and volumes of a first space and a second space while the pressurizing apparatus is filled with the photoresist.

FIG. 6 illustrates a location of a film, and volumes of a first space and a second space while the pressurizing apparatus is filled with the photoresist. The pressurization gas supply source 75 side of the fourth valve 71a is closed and the drain line 72 side is opened, and as a result, the volume of the first space 111 becomes larger as the photoresist is filled in the first space 111.

Figure 7:
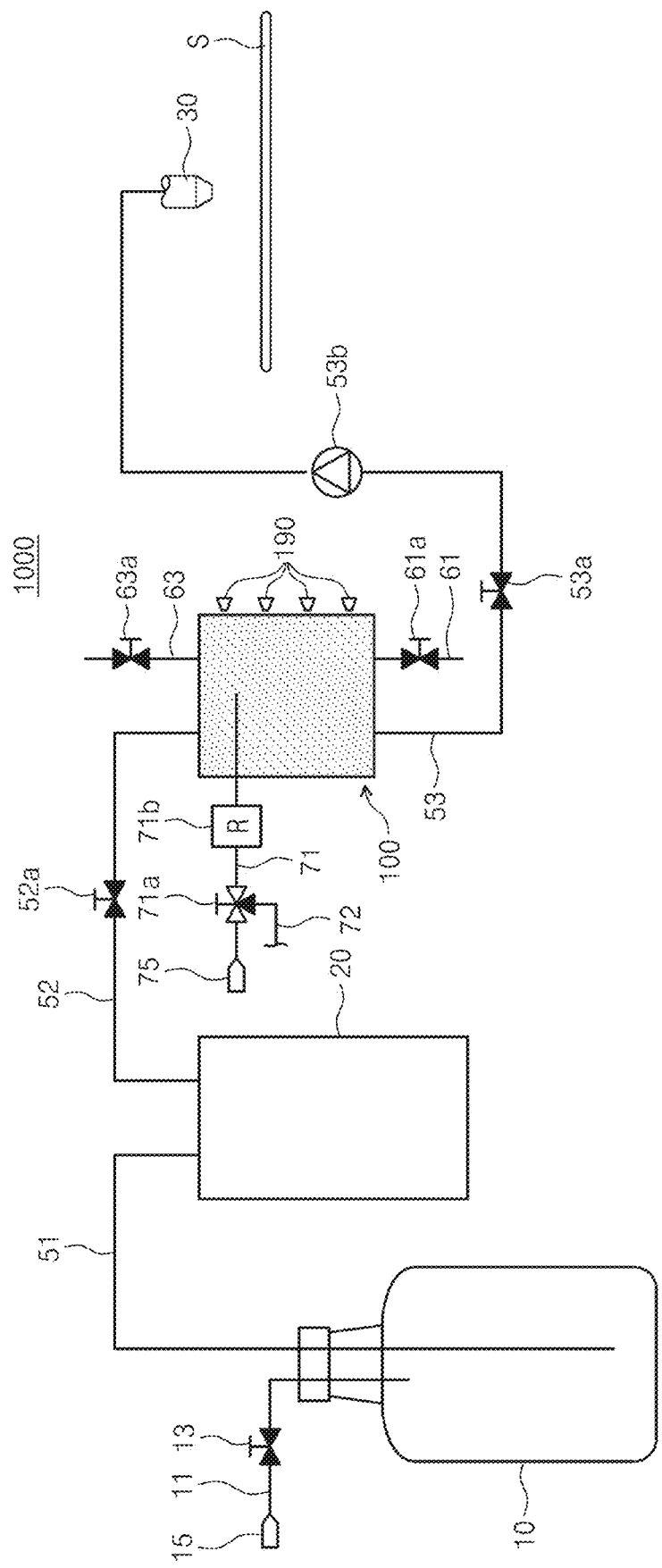
FIG. 7 is a diagram illustrating a state in which the first space is pressurized while the pressurizing apparatus is filled with the photoresist.

FIG. 7 is a diagram illustrating a state in which the first space is pressurized while the pressurizing apparatus is filled with the photoresist. In a state in which the photoresist is filled in the pressurizing apparatus 100, the valves are controlled as in [Table 2].

TABLE 2

| Control target | Control method |
| --- | --- |
| Second valve 52a | Closed |
| Third valve 53a | Closed |
| Fourth valve 71a | Pressurization gas supply source 75 side - opened<br>Drain line 72 side - closed |
| Drain valve 61a | Closed |
| Air bubble discharge valve 63a | Closed |

Figure 8:
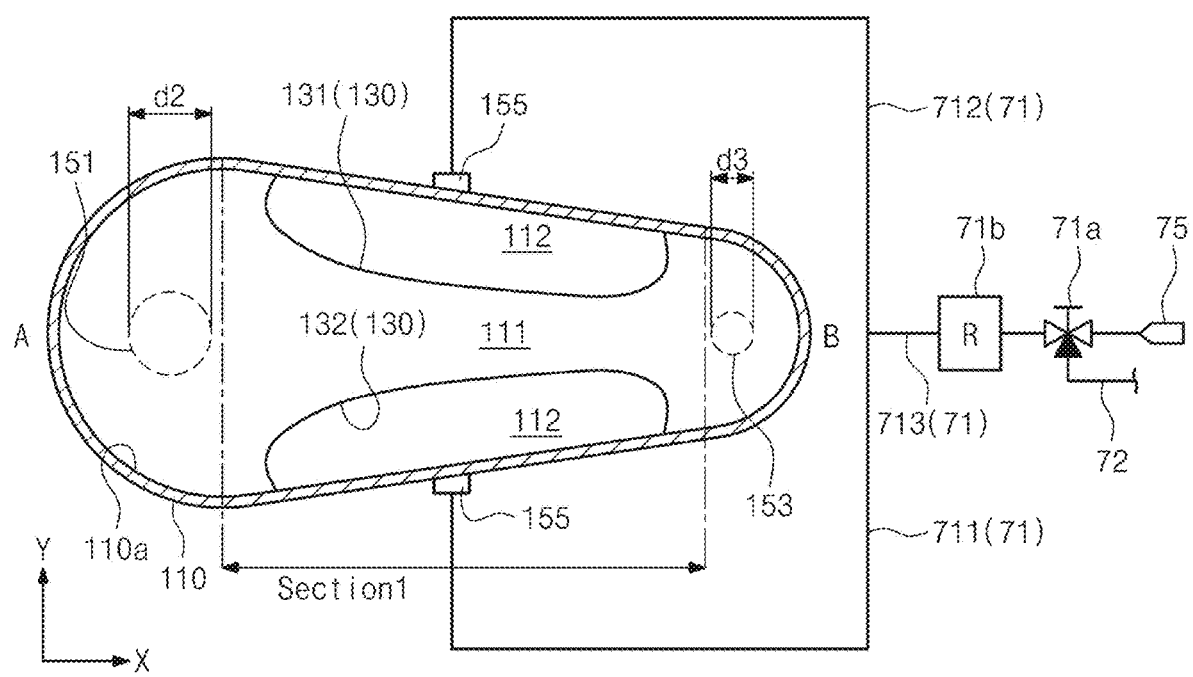
FIG. 8 illustrates the volumes of the first space and the second space which are changed as the first space is pressurized while the pressurizing apparatus is filled with the photoresist.

FIG. 8 illustrates the volumes of the first space and the second space which are changed as the first space is pressurized while the pressurizing apparatus is filled with the photoresist. The pressurization gas is filled in the second space 112 and the volume becomes larger, and as a result, the first space 111 is pressurized and the volume is reduced. As the pressure increases while an internal volume of the first space 111 is reduced, the photoresist is pressurized.

Figure 9:
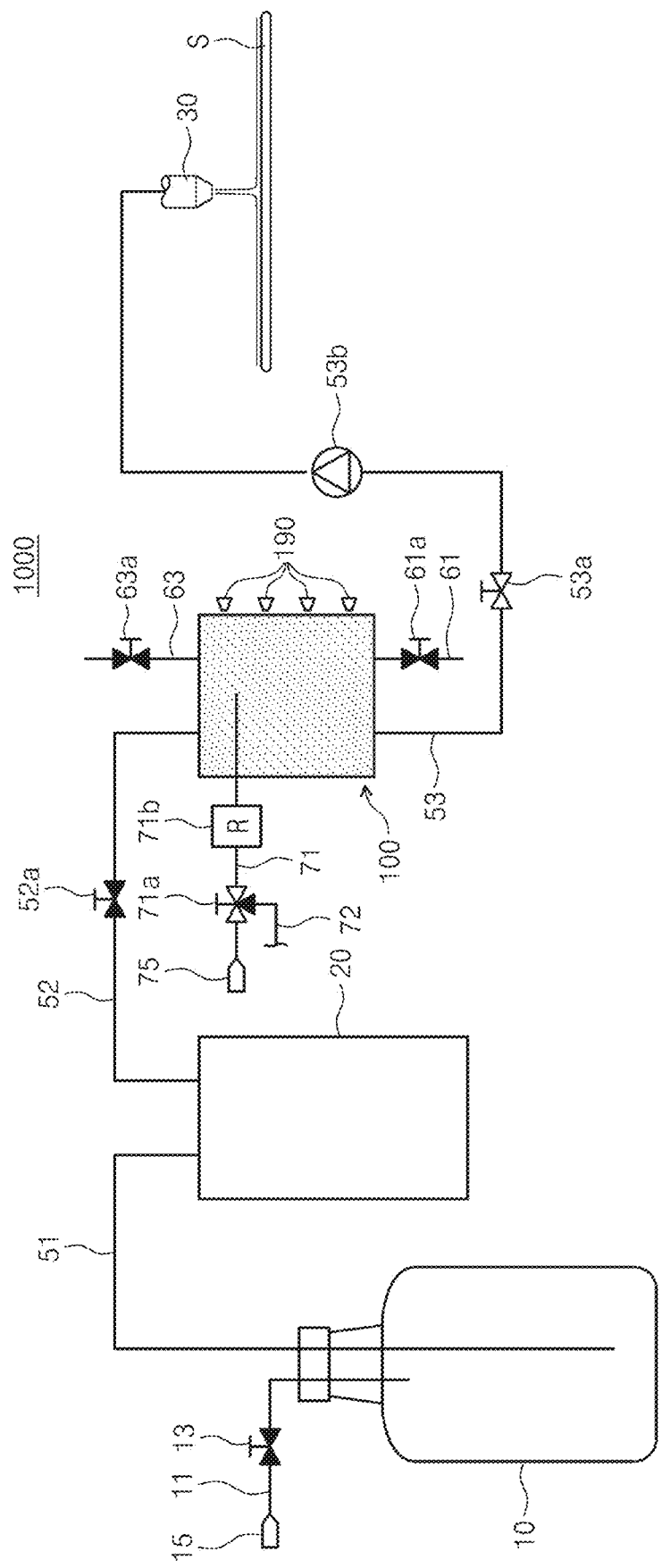
FIG. 9 is a diagram illustrating a state of supplying the photoresist to a substrate through a nozzle.

FIG. 9 is a diagram illustrating a state of supplying the photoresist to a substrate through a nozzle. In a state in which the photoresist is maintained at a positive pressure through the pressurizing apparatus 100, the photoresist which is delivered to the nozzle 30 along the third supply line 53 is supplied to the substrate S by the pump 53b. Even though the amount of the photoresist is reduced as the photoresist is discharged from the pressurizing apparatus 100, the photoresist is continuously pressurized while the volume of the second space 112 becomes larger by supplying the pressurization gas. In a state in which the photoresist is supplied to the substrate S, the valves are controlled as in [Table 3].

TABLE 3

| Control target | Control method |
| --- | --- |
| Second valve 52a | Closed |
| Third valve 53a | Opened |
| Fourth valve 71a | Pressurization gas supply source 75 side - opened<br>Drain line 72 side - closed |
| Drain valve 61a | Closed |
| Air bubble discharge valve 63a | Closed |

Figure 10:
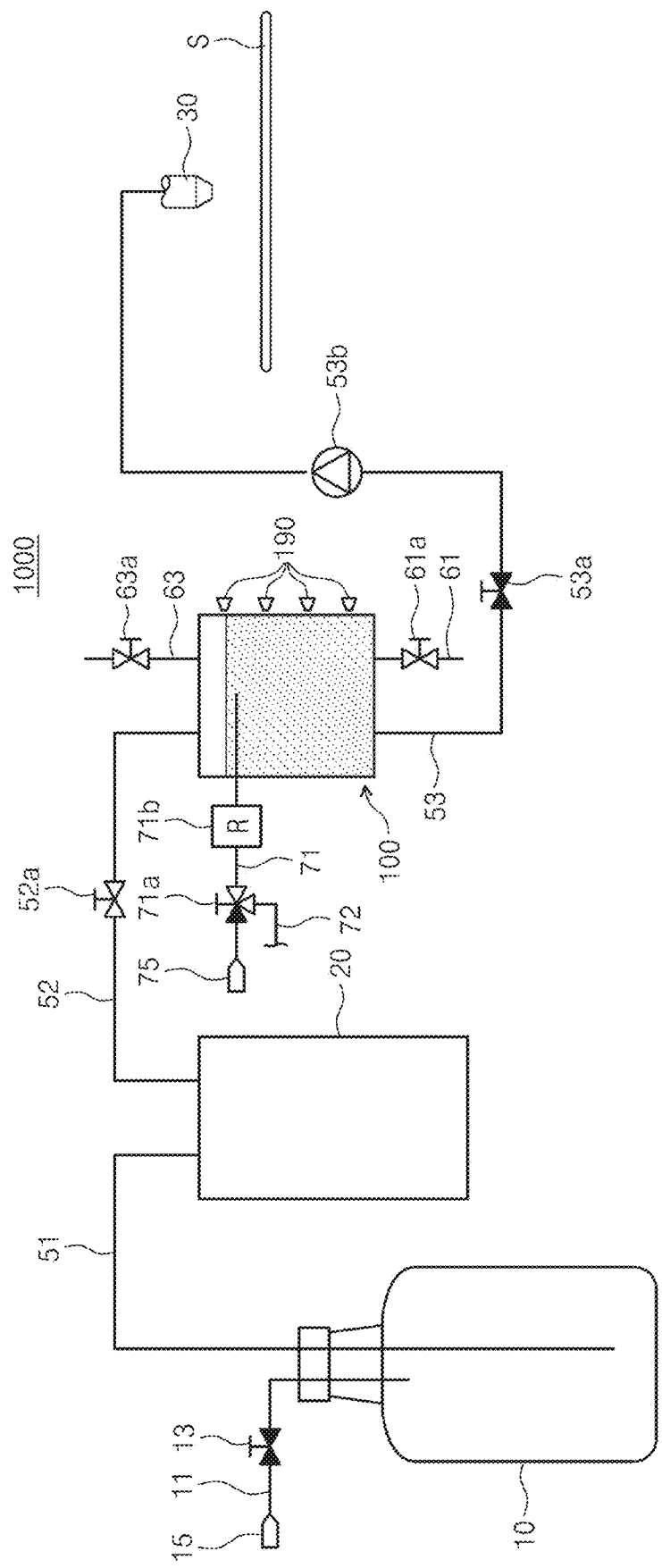
FIG. 10 is a diagram illustrating a state of draining the photoresist filled in the pressurizing apparatus.

FIG. 10 is a diagram illustrating a state of draining the photoresist filled in the pressurizing apparatus. In a state in which the photoresist is drained from the pressurizing apparatus 100, the valves are controlled as in [Table 4].

TABLE 4

| Control target | Control method |
| --- | --- |
| Second valve 52a | Opened, and then closed |
| Third valve 53a | Closed |
| Fourth valve 71a | Pressurization gas supply source 75 side - closed<br>Drain line 72 side - opened |
| Drain valve 61a | Opened |
| Air bubble discharge valve 63a | Opened |

According to the embodiment, the photoresist may be quickly filled through the first inlet 151, and when the photoresist is sent to the nozzle 30, the photoresist is discharged through the first outlet 152 to charge and discharge in a state of securing the stability of the photoresist at a low flow rate. On the contrary, when the photoresist is drained, the photoresist is drained through the second outlet 154 having a smaller diameter than the first outlet 152, and since the second outlet 154 is provided at the second side B, the pressure of the photoresist may be changed in a process in which the photoresist flows from the first inlet 151 to the second outlet 154, so an activity of the bubble is increased to facilitate bubble discharging. That is, since internal shapes of the housing at the first side A and the second side B are asymmetric, the pressure change may be caused, and the bubble discharging is facilitated.

Figure 11:
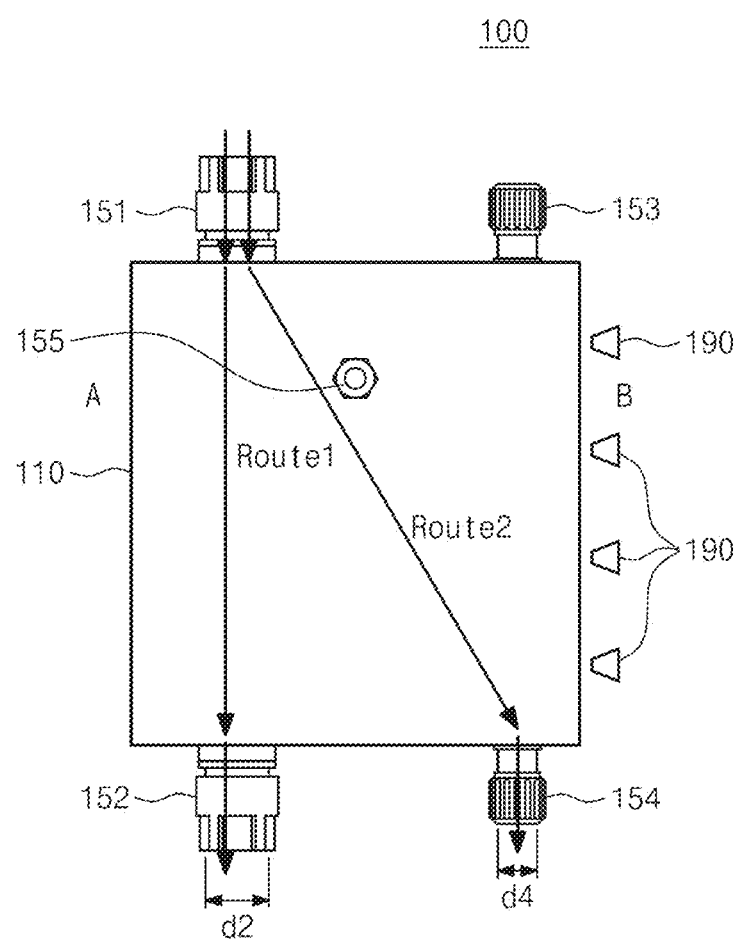
FIG. 11 is a diagram for describing a route in which the photoresist flows when the photoresist is supplied to the nozzle and a route in which the drained photoresist flows.
Figure 12:
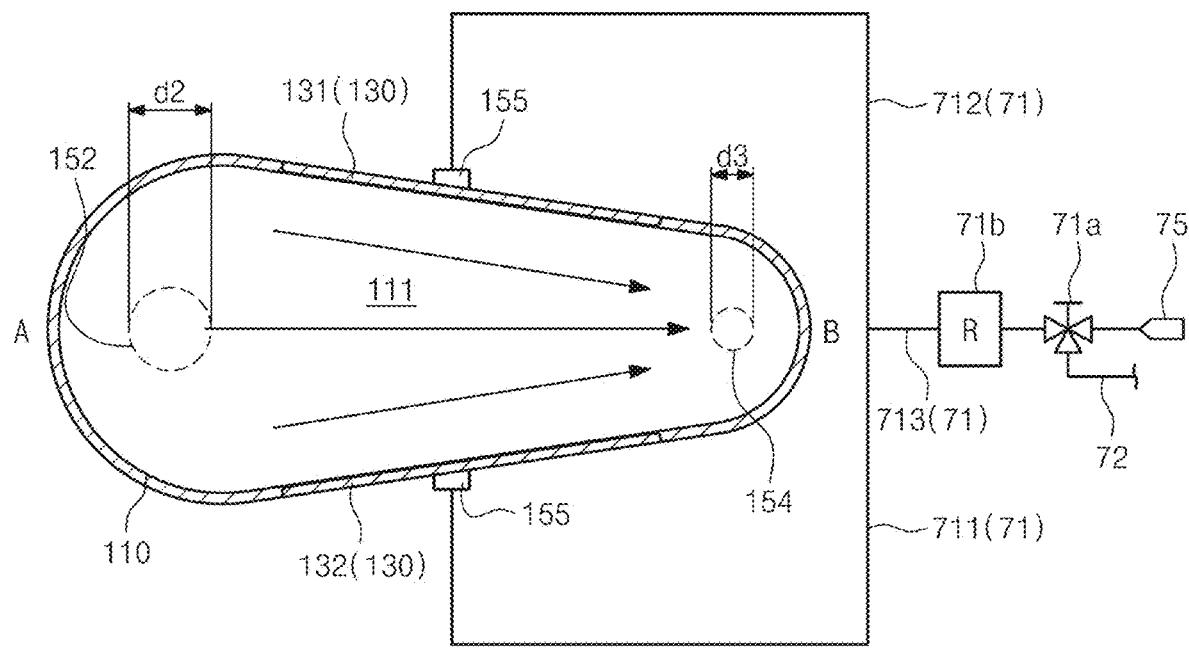
FIG. 12 is a diagram for describing a principle in which a pressure is applied to the photoresist by a direction in which the drained photoresist flows.

FIG. 11 is a diagram for describing a route (Route 1) in which the photoresist flows when the photoresist is supplied to the nozzle and a route (Route 2) in which the drained photoresist flows. FIG. 12 is a diagram for describing a principle in which a pressure is applied to the photoresist by a direction in which the drained photoresist flows. A matter in which the bubble discharging is facilitated when the photoresist is drained will be described through FIGS. 11 and 12.

Figure 13:
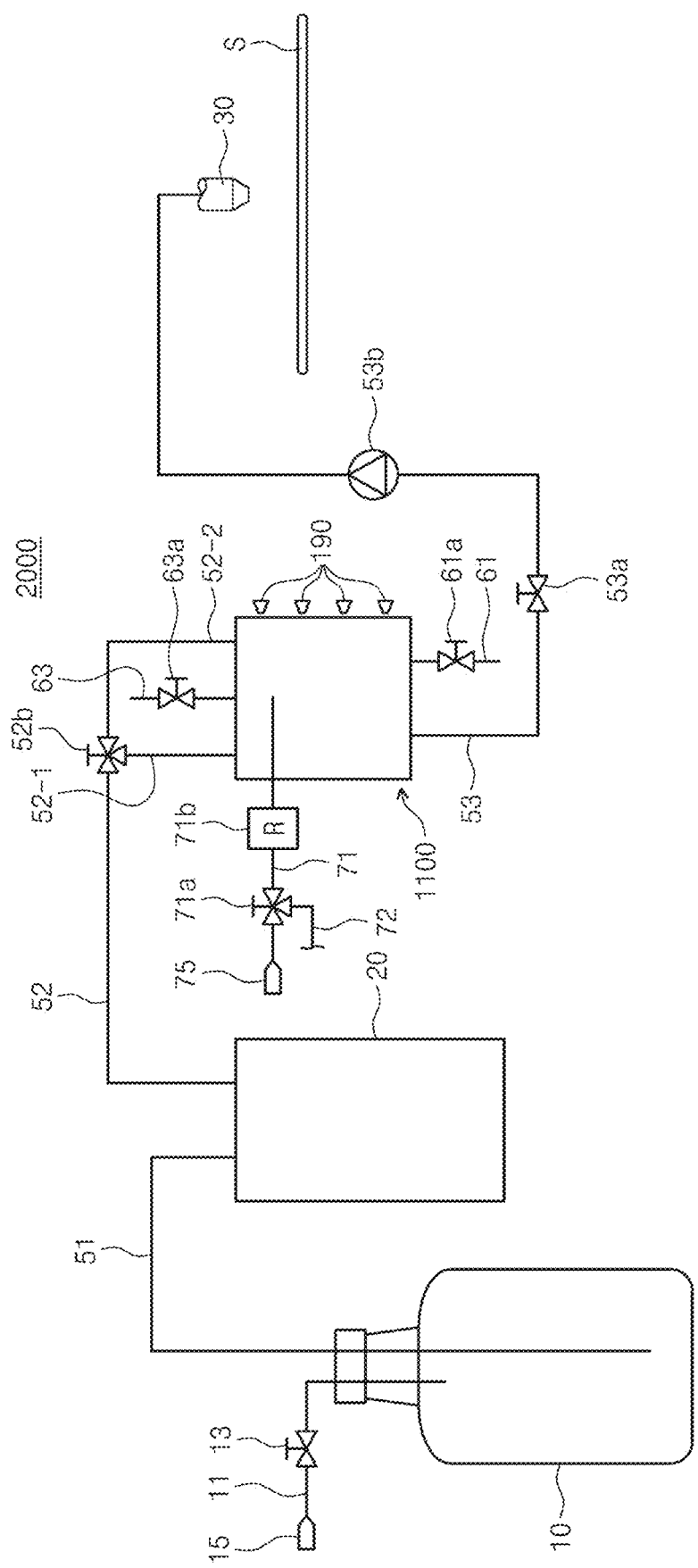
FIG. 13 is a diagram illustrating a system for pressurizing a photoresist according to a second embodiment of the present invention and a system for supplying a photoresist according to an embodiment, which including the same.
Figure 14:
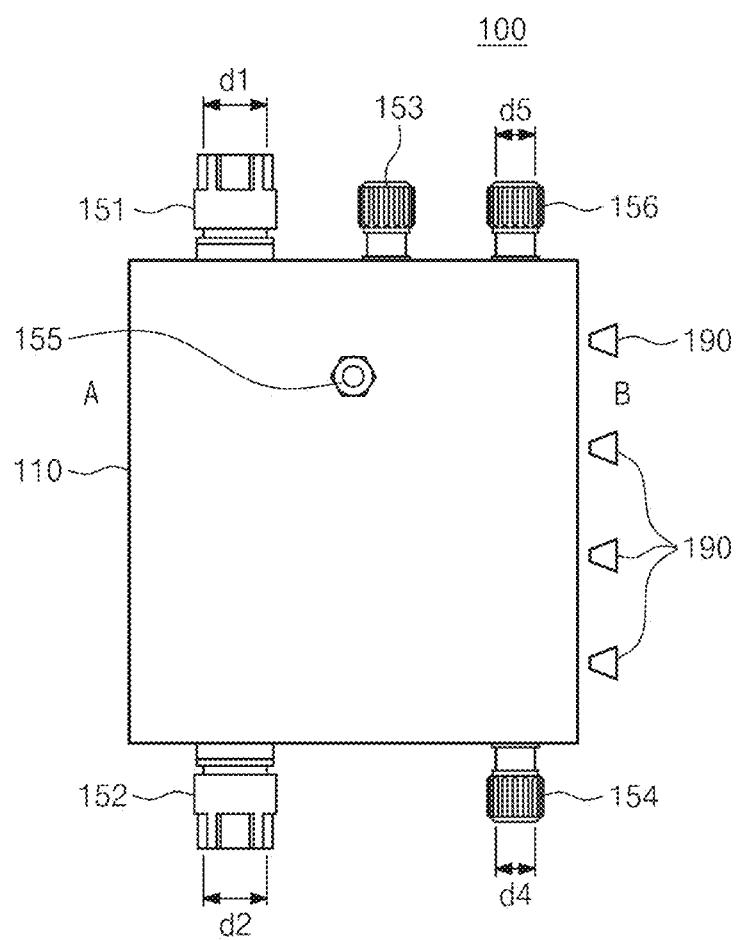
FIG. 14 is a side view of a pressurizing apparatus according to a second embodiment of the present invention.

FIG. 13 is a diagram illustrating a system for pressurizing a photoresist and a system for supplying a photoresist according to an embodiment, which including the same according to a second embodiment of the present invention. FIG. 14 is a side view of a pressurizing apparatus according to a second embodiment of the present invention. The pressurizing apparatus 1100 and the photoresist supplying system 2000 according to the second embodiment will be described with reference to FIGS. 13 and 14. In the description of the second embodiment, the same component as in the first embodiment will be denoted by the same reference numeral as in the first embodiment, and the description in the second description will be substituted with the description in the first embodiment.

The pressurizing apparatus 1100 according to the second embodiment further a second inlet 156. The second inlet 156 is provided at the upper side to be in communication with the first space 111. A diameter d5 of the second inlet 156 is smaller than the diameter d1 of the first inlet 151. A 3-way valve 52b is installed on the second supply line 52. A primary side of the 3-way valve 52b is connected to a buffer tank 20. One of secondary sides of the 3-way valve 52b is connected to the first inlet 151 of the pressurizing apparatus 1100. The other one of the secondary sides of the 3-way valve 52b is connected to the second inlet 156 of the pressurizing apparatus 1100. As a result, in filling the photoresist in the pressurizing apparatus 100, any one of the first inlet 151 and the second inlet 156 having different diameters may be selected. For example, at initial set-up, the photoresist is charged at a high flow rate by using the second inlet 156 having the smaller diameter, and pressurized for a predetermined time to move the bubble upward, and then additionally supply the photoresist through the first inlet 151.

Figure 15:
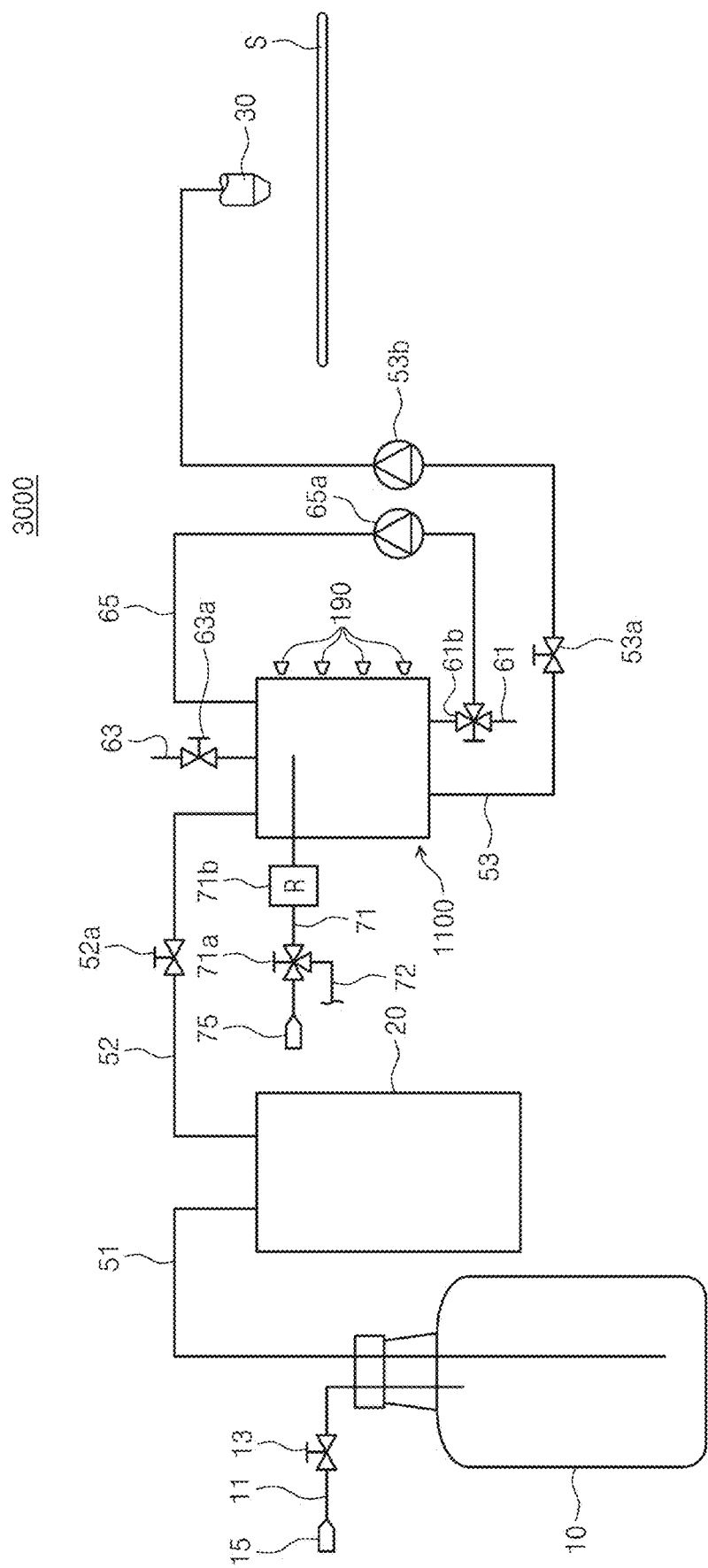
FIG. 15 is a diagram illustrating a system for pressurizing a photoresist according to a second embodiment of the present invention and a system for supplying a photoresist according to another embodiment, which including the same.

FIG. 15 is a diagram illustrating a system for pressurizing a photoresist according to a second embodiment of the present invention and a system for supplying a photoresist according to another embodiment, which including the same. The photoresist supplying system 3000 will be described with reference to FIG. 15. In this description, the same component as in the embodiment is denoted by the same reference numeral as in the embodiment, and this description will be substituted with the description in the embodiment.

The second inlet 156 of the pressurizing apparatus 1100 is connected to one end of a circulation line 65. The other end of the circulation line 65 is connected to the second outlet 154. The drain line 61 is connected to the circulation line 65. A circulation pump 65a is installed on the circulation line 65. The circulation pump 65a provides a pressure so that the photoresist is circulated through the circulation line 65. A 3-way valve 61b is installed at a portion where the drain line 61 and the circulation line 65 are connected. As the 3-way valve 61b, a 3-way valve that drains the photoresist discharged from the pressurizing apparatus 100 to the drain line 61 through the second outlet 154 and a 3-way valve that circulates the photoresist through the circulation line 65 may be selected. The pressurizing apparatus 1100 provides the second inlet 156 and the second outlet 154 to connect the circulation line 65, thereby implementing a function of circulating the photoresist.

Meanwhile, in addition to the embodiment described above, contraction and expansion degrees of the first film 131 and the second film 132 may be different from each other. For example, a method for using different materials for the first film 131 and the second film 132 or selectively pressurizing the first film 131 and the second film 132 may be adopted. Through this, a method for removing the bubbles attached to the inside of the pressurizing apparatus may be variously implemented.

The above embodiments are presented to help understand the present invention, and it should be understood that the scope of the present invention is not limited, and that various modified embodiments belong to the scope of the present invention. The drawing provided by the present invention just illustrates an optimal embodiment of the present invention. The technical protection scope of the protection of the present invention should be determined by the technical idea of the claim, and it should be understood that the technical protection scope of the present invention is not limited to the literary description of the claim itself, but actually influences the invention of the invention of category of a uneven technical value.

What is claimed is:

1. A pressurizing apparatus comprising:
    a housing including a wall surface defining an internal space;
    a film separating the internal space into a first space and a second space;
    a first inlet which is in communication with the first space;
    a first outlet which is in communication with the first space;
    a second outlet which is in communication with the first space; and
    a pressurization gas inlet which is in communication with the second space,
    wherein
    in a transverse section, the housing has a first width in a first direction and a second width in a second direction perpendicular to the first direction, the first width being larger than the second width,
    in the first direction, the housing includes a first side and a second side opposite to the first side, and
    the housing includes a section in which a width of the housing in the second direction narrows from the first side to the second side.

2. The pressurizing apparatus of claim 1, wherein the first inlet is at an upper portion adjacent to the first side of the housing.

3. The pressurizing apparatus of claim 1, wherein the first outlet is at a lower portion adjacent to the first side of the housing.

4. The pressurizing apparatus of claim 1, wherein the second outlet is at a lower portion adjacent to the second side of the housing.

5. The pressurizing apparatus of claim 1, wherein the film is on the wall surface toward the second side from the first side on the wall surface.

6. The pressurizing apparatus of claim 1, further comprising:
    an air bubble discharging outlet in communication with the first space at an upper side of the housing.

7. The pressurizing apparatus of claim 6, wherein the air bubble discharging outlet is adjacent to the second side.

8. The pressurizing apparatus of claim 1, wherein a diameter of the second outlet is smaller than a diameter of the first outlet.

9. The pressurizing apparatus of claim 1, wherein the second outlet is connected to a drain line.

10. The pressurizing apparatus of claim 1, further comprising:
    a second inlet at an upper side of the housing; and
    a circulation line having a first end connected to the second outlet and a second end connected to the second inlet.

11. The pressurizing apparatus of claim 1, further comprising:
    a second inlet at an upper side of the housing,
    wherein the second outlet has a smaller diameter than the first inlet.

12. The pressurizing apparatus of claim 10, further comprising:
    a drain line connected to the circulation line.

13. The pressurizing apparatus of claim 1, further comprising:

one or more level sensors at a location not overlapped with the film at an outside of the housing.

14. A system for supplying a photoresist, the system comprising:
a buffer tank configured to temporarily store a liquid;
a nozzle configured to discharge the liquid to a substrate; and
a pressurizing apparatus on a supply line connecting the buffer tank and the nozzle,
wherein the pressurizing apparatus includes,
a housing which includes a wall surface defining an internal space, wherein
in a transverse section, the housing has a first width in a first direction and a second width in a second direction perpendicular to the first direction, the first width being larger than the second width,
in the first direction, the housing includes a first side and a second side opposite to the first side, and
the housing includes a section in which a width of the housing in the second direction narrows from the first side to the second side;
a film on the wall surface, the film extending on the wall surface from the first side to the second side and the film configured to separate the internal space into a first space and a second space;
a first inlet at an upper side adjacent to the first side, and in communication with the first space and connected to a supply line connected to the buffer tank;
a first outlet at a lower side adjacent to the first side, and in communication with the first space and connected to a supply line connected to the nozzle;
a second outlet at the lower side adjacent to the second side, and in communication with the first space and directly or indirectly connected to a drain line; and
a pressurization gas inlet in communication with the second space, and connected to a pressurization gas supply line supplying a pressurization gas.

15. The system of claim 14, further comprising:
an air bubble discharging line connected to the upper side of the housing.

16. The system of claim 14, wherein a diameter of the second outlet is smaller than a diameter of the first outlet.

17. The system of claim 14, further comprising:
a second inlet in communication with the first space at the upper side of the housing; and
a circulation line having a first end connected to the second outlet and a second end connected to the second inlet, wherein the drain line is connected to the circulation line.

18. The system of claim 14, further comprising:
a second inlet at the upper side of the housing,
wherein the second outlet has a smaller diameter than the first inlet.

19. The system of claim 14, further comprising:
a controller,
wherein the controller is configured to,
control the pressurization gas not to be supplied when the liquid stored in the buffer tank is filled in the pressurizing apparatus, and
supply the pressurization gas to the second space to pressurize the liquid after the pressurizing apparatus is filled with the liquid.

20. A system for supplying a photoresist, the system comprising:
a buffer tank configured to temporarily store a liquid;
a nozzle configured to discharge the liquid to a substrate; and
a pressurizing apparatus on a supply line connecting the buffer tank and the nozzle,
wherein the pressurizing apparatus includes,
a housing which includes a wall surface defining an internal space, wherein
in a transverse section, the housing has a first width in a first direction and a second width in a second direction perpendicular to the first direction, the first width being larger than the second width,
in the first direction, the housing includes a first side and a second side opposite to the first side, and
the housing includes a section in which a width of the housing in the second direction narrows from the first side to the second side;
a film on the wall surface toward the second side from the first side on the wall surface and configured to separate the internal space into a first space and a second space;
a first inlet at an upper portion adjacent to the first side, and in communication with the first space and connected to a supply line connected to the buffer tank;
a second inlet at an upper side of the housing and in communication with the first space;
a first outlet at a lower side adjacent to the first side, and in communication with the first space and connected to a supply line connected to the nozzle;
a second outlet at the lower side adjacent to the second side, and in communication with the first space and directly or indirectly connected to a drain line;
a pressurization gas inlet in communication with the second space, and connected to a pressurization gas supply line supplying pressurization gas; and
an air bubble discharging line connected to the upper side of the housing, wherein
the second inlet has a smaller diameter than the first inlet, and
a diameter of the second outlet is smaller than a diameter of the first outlet.

* * * * *